United States Patent

Lutz et al.

[11] Patent Number: 5,719,798
[45] Date of Patent: Feb. 17, 1998

[54] PROGRAMMABLE MODULO K COUNTER

[75] Inventors: David R. Lutz; D. N. Jayasimha, both of Columbus, Ohio

[73] Assignee: Lucent Technologies Inc., Murray Hill, N.J.

[21] Appl. No.: 577,953

[22] Filed: Dec. 22, 1995

[51] Int. Cl.[6] .................................................. G06F 7/68
[52] U.S. Cl. ........................................ 364/703; 377/126
[58] Field of Search ............................ 364/703; 377/126, 377/124, 122

[56] References Cited

U.S. PATENT DOCUMENTS 4,020,362  4/1977  Suzuki et al. ........................ 377/126
4,390,960  6/1983  Yamashita et al. ................... 364/703
4,509,183  4/1985  Wright ................................. 377/126
4,991,188  2/1991  Perkins ................................ 364/703
5,088,057  2/1992  Amrany ............................... 364/703

OTHER PUBLICATIONS

"Binary Counter with Counting Period of One Half Adder Independent of Counter Size", Jun. 1989 IEEE, vol. 36, No. 6, pp. 924–926.

*Primary Examiner*—David H. Malzahn

[57] ABSTRACT

A modulo-k counter or frequency divider that produces an output pulse for every k clock pulses. The counter is programmable and synchronous, and is faster than any other programmable frequency divider.

1 Claim, 1 Drawing Sheet

PROGRAMMABLE MODULO K COUNTER

BACKGROUND OF THE INVENTION

1. Field of the Invention

The present invention relates to computer arithmetic and more specifically, binary counters.

2. Description of the Related Art

A modulo-k counter, or frequency divider, is a binary counter that provides an output pulse for every k input pulses. Frequency dividers are used in many different circuits, and are distinguished from other counters in that the output pulse is much more important than the count itself. In many cases, the count is not even available. A simple example of such a frequency divider is a ring counter.

It is desirable for frequency dividers to have a fast period, or time between input pulses. Frequency dividers are often called upon to divide very fast signals. For example, the period is a small constant that is independent of the length of the modulus. It is also desirable for the frequency divider to be programmable, i.e., having a modulus that is not fixed in hardware. For example, a circuit might need to produce an output pulse on the 4th, 9th, and 12th input pulses. This type of programmability obviates the need to be able to read the count. It is also desirable to have a frequency divider that is easy to use.

SUMMARY OF THE INVENTION

An embodiment of the present invention provides a modulo-k counter or frequency divider that produces an output pulse for every k clock pulses. The counter is programmable and synchronous, and is much faster than any other programmable frequency divider, with a period equal to the delay of a half-adder, a 3-input AND gate, and a latch.

DETAILED DESCRIPTION OF THE INVENTION

With regards to notation, lower case letters are used to represent numbers and upper case are used to represent n-bit words. The subscripted lower case letters represent bits. The meaning of other symbols are given in Table 1. In addition, it should be noted that the lower order bit in a word is bit 0.

TABLE 1

| Symbol | Meaning |
| --- | --- |
| $\cap$ | bitwise and |
| $\cup$ | bitwise or |
| $\oplus$ | bitwise exclusive-or |
| $\bar{x}_i$ | not $x_i$ |
| $\bar{X}$ | one's complement of X |

An n-bit half adder consists of n independent half adders. It takes two n-bit two's complement numbers as inputs, and produces two outputs: an n-bit sum and an n-bit carry. Let $X = x_{n-1} \ldots x_1, x_0$, and $Y = y_{n-1} \ldots y_1, y_0$ be n-bit words with low order bits $x_0$ and $y_0$. An n-bit half adder produces a carry word $C = c_{n-1} \ldots c_1, c_0$ and a sum word $S = s_{n-1} \ldots s_1, s_0$ such that $$C_i = x_{i-1} \cap y_{i-1} \tag{2}$$

$$S_i = X_i \oplus Y_i$$

Note that $c_0$ is always 0, and that $$C + S = X + Y \text{ (modulo } 2^n) \tag{2a}$$

The high order carry bit $c_n$ is not part of C, but is sometimes useful as part of a larger calculation.

(C, S) is in half-adder form (or h-a form) if there exist X and Y satisfying equation 2. We write (C, S)=ha(X, Y).

A number in half-adder form is represented by the C or carry component and the S or sum component. With regard to the C and S components, it should be noted that $$C + S = -1 \leftrightarrow S = -1 \tag{3}$$

With regard to relationship 3, the definition of a two's complement number shows that $X + Y = -1 \leftrightarrow Y = \bar{X}$. Then according to equation 2, $S = X \oplus \bar{X} = -1$ As a result, S consists of all ones. A quick examination of equations 1 and 2 shows that only one of $c_i$ and $s_{i-1}$ can be set (=1) for $i=1, \ldots, n-1$, as a result, when $C+S=-1$, $C=0$ and $S=-1$.

Figure 1:
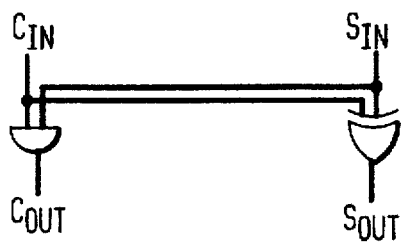
FIG. 1 illustrates a half-adder.
Figure 2:
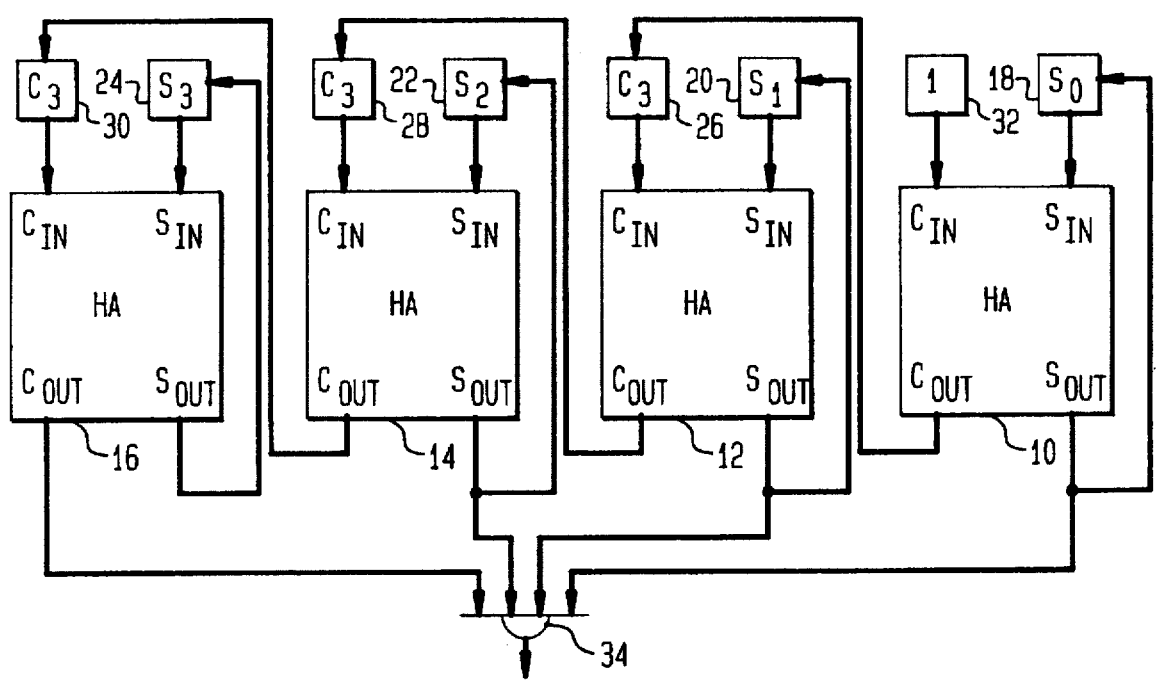
FIG. 2 illustrates a programmable modulo-k counter.

FIG. 2 illustrates a programmable modulo-k counter using half-adders such as the half-adders illustrated in FIG. 1. Half-adders 10, 12, 14 and 16 are well known in the art. The S output of half-adders 10, 12, 14 and 16 are captured by latches 18, 20, 22 and 24, respectfully. The outputs of clocked latches 18, 20, 22 and 24 are fed to the S input of half-adders 10, 12, 14 and 16, respectfully. The carryout outputs of half-adders 10, 12, and 14 are fed to clocked latches 26, 28 and 30, respectfully. Latch 32 is fed a logic 1. The latches may be implemented using registers or D type flip-flaps. The outputs of latches 32, 26, 28 and 30 are fed to the carry input of half-adders 10,12,14 and 16, respectfully. The S outputs of the half-adders are fed to AND gate 34 which provides an output pulse. Generally, the half-adders and their associated latches can be thought of as an incrementer and AND gate 34 can be thought of as an detector that detects when $S = -1$.

FIG. 2 is a programmable modulo-k counter based on relationship 3. Initially, (C, S) is set to $(0,\bar{k})$. At each input clock pulse (the clock input is not shown), the sum in (C, S) increases by one because of the 1 that is input to the low order half adder. Since the increment value is 1 the incrementer itself can be constructed out of half adders, and (C, S) is always in h-a form. After k input pulses $C+S=-1$, and by relationship 3, all of the bits of S will be 1. This reduces the detector to an n-input and of the bits of S. Note that the 1 that is input to the low-order half adder is not part of C. By definition, $c_0=0$, and since a 0 has no effect on the sum, we do not need to use it as an input to the half adder. The place where $c_0$ would have been input is a convenient spot to place a 1 to cause the sum to increase on every pulse.

The counter of FIG. 2 is a synchronous counter since the latches transfer their inputs to their outputs when they receive the clock pulse. As a result, the input clock pulse (which is not shown in the diagram) causes all of the half adders to generate their sums simultaneously.

For example, table 2 shows the contents of the C and S registers for a 5-bit h-a form counter that detects when 18 input pulses have been received. Initially (C, S) is set to (0, $\overline{18}$)=(0, 13). After 18 input pulses $S=-1$.

The frequency divider can handle any input multiple in the range from 1 to $2^n$. The period is lower bounded by the sum of the delays due to a latch, a half adder, and an n-input and gate.

| count | C | S |
|-------|-------|-------|
| 0 | 00000 | 01101 |
| 1 | 00010 | 01100 |
| 2 | 00000 | 01111 |
| 3 | 00010 | 01110 |
| 4 | 00100 | 01101 |
| 5 | 01010 | 01000 |
| 6 | 10000 | 00011 |
| 7 | 00010 | 10010 |
| 8 | 00100 | 10001 |
| 9 | 00010 | 10100 |
| 10 | 00000 | 10111 |
| 11 | 00010 | 10110 |
| 12 | 00100 | 10101 |
| 13 | 01010 | 10000 |
| 14 | 00000 | 11011 |
| 14 | 00010 | 11010 |
| 15 | 00100 | 11001 |
| 17 | 00010 | 11100 |
| 18 | 00000 | 11111 |

Table 2: Detecting the 18th Input Pulse in H-A Form

A closer examination of table 2 shows that, at least for this example, the high order bits of S are stable as the number of pulses approaches 18. The highest order bit, $s_4$, does not change after it is set in step 7. The next highest order bit, $s_3$, does not change after it is set in step 14. Only the two low-order bits of S change when the 18th pulse is received. If this pattern is true in general, then we can replace the logarithmic time n-input and with a constant time detector. To prove this, we will need several lemmas. Assume that (C, S) is in h-a form, and that (C, S) is incremented at each input pulse using the in FIG. 1. Let u be the n+1-bit unsigned sum of C and S.

Lemma 1 if $u<2^n-1$, then $c_n$ changes from 0 to 1 when $C+S=2^n+n-1$.

Proof: Since $u<2^n-1$, $c_n=0$ while $C+S \leq 2^n-1$. By relationship, when $C+S=2^n-1=-1$ then $S=-1$. Since $C+S=S=-1$ we also have $C=0$.

The first input pulse after $S=-1$ causes a carry into bit $c_1$, the second pulse causes a carry into bit $c_2$, and the nth pulse causes $c_n$ to change from 0 to 1. At this point $C+S=2^n-1+n$. Lemma 1 tells us what the sum of two words is when a carry is generated.

Lemma 2 if $u<2^n-1$, and if $s_j=s_{j+1}=\ldots=s_{n-1}=1$, then $s_j=1$ while $C+S \leq 2^n-1$.

Proof: Since $u<2n-1$, $cj-cj+1=\ldots=cn-1=0$, and the sum of the low order j bits of C and S are less than $2^j-1$. Applying lemma 3 to the low order j bits of C and S we have $c_j \neq 1$ until after all of the low order j bits of S are 1.

Lemma 3 if $u<2^n-1$, and if $s_{j+2}=s_{j+3}=\ldots=s_{n-1}=1$, then bit $s_j$ is set $2^j-1$ input pulses after bit $s_{j+1}$ is set.

Proof: Since $u<2^n-1$ and $s_{j+2}=s_{j+3}=\ldots=s_{n-1}=1$, then the low order j+2 bits of (C, S) sum of less than $2^{j+2}-1$. Applying lemma 1 to these bits we see that bit $c_{j+1}$ is set when the count in those bits is $2^{j+1}+j+1-1=2^{j+1}+j$. Bit $s_{j+1}$ is set one pulse later, when the count in those bits is $2^j+j+1$. At this point, the count in the low order j+1 bits is j+1, which is less than $2^{j+1}-1$. Applying lemma 1 to the low order j+1 bits of (C, S) we see that bit cj is set when the count in those bits is $2^j+j-1$, and bit sj is set when the count in those bits is $2^j+j$. This occurs exactly $2^j+j-(j+1)=2^j-1$ input pulses after bit $s_{j+1}$ is set.

Figure 3:
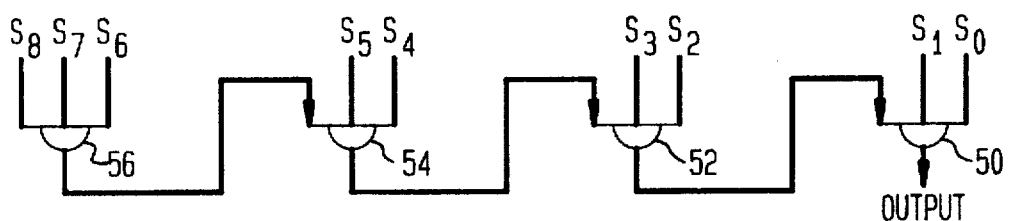
FIG. 3 illustrates a detector.

In light of the above discussion, the detector of FIG. 3 may be used. AND gates 50, 52, 54, and 56 receive or monitor the S outputs of half-adders connected in a manner similar to the connections illustrated in FIG. 2. In the embodiment of FIG. 3, three input AND gates are used to receive S inputs from a total of nine half-adders, where $s_0$ is the least significant or lowest order half-adder output. AND gate 56 receives half-adder outputs s8, s7, and s6. AND gate 54 receives half-adder outputs s5 and s4, and the output from AND gate 56. AND gate 52 receives half-adder outputs s3 and s2, and the output from AND gate 54. AND gate 50 receives half-adder outputs s1 and s0, and the output from AND gate 52. The output of AND gate 50 is the output of the detector circuit.

A variation of the frequency divider is a counter that produces a fixed sequence of output pulses. Instead of producing an output every k cycles, the counter is required to cycle through m different output multiples ($K_0, K_1, \ldots, K_{m-1}$). A small modification to the frequency divider in FIG. 2 allows it to perform this function. The values ($K_0, K_1, \ldots, K_{m-1}$) are stored in a memory. Initially, (C, S)=(0, $K_0$). Whenever the ith output pulse is generated, (C, S) is set to (0, $K_i$).

It should be noted that the above figures may be generalized to any n.

The invention claimed is:

1. A programmable modulo-k counter, comprising:

first half-adder means for producing a first carryout output bit and a first sum output bit in response to a first carryin input bit having a value of logic 1 and a first sum input bit;

second half-adder means for producing a second carryout output bit and a second sum output bit in response to a second carryin input bit and a second sum input bit;

third half-adder means for producing a third sum output bit in response to a third carryin input bit and a third sum input bit;

first sum storage means for storing the first sum output bit from the first half-adder means, the first sum storage means providing at least a clock period delay and outputting the first sum output bit as the first sum input bit;

first carryin storage means for storing the first carryout output bit from the first half-adder means, the first carryin storage means providing at least a clock period delay and outputting the first carryout output bit as the second carryin input bit;

second sum storage means for storing the second sum output bit from the second half-adder means, the second sum storage means providing at least a clock period delay and outputting the second sum output bit as the second sum input bit;

second carryin storage means for storing the second carryout output bit from the second half-adder means, the second carryin storage means providing at least a clock period delay and outputting the second carryout output bit as the third carryin input bit;

third sum storage means for storing the third sum output bit from the third half-adder means, the third sum storage means providing at least a clock period delay and outputting the third sum output bit as the third sum input bit; and detection means for providing an output indicating that the first, second and third sum output bits are logic 1.

* * * * *